United States Patent [19]

Avery et al.

[11] Patent Number: 5,506,519

[45] Date of Patent: Apr. 9, 1996

[54] LOW ENERGY DIFFERENTIAL LOGIC GATE CIRCUITRY HAVING SUBSTANTIALLY INVARIANT CLOCK SIGNAL LOADING

[75] Inventors: Steven C. Avery, Castle Hill, Australia; John S. Denker, Leonardo; Alexander G. Dickinson, Neptune, both of N.J.; Alan H. Kramer, Berkeley, Calif.; Thomas R. Wik, Hanover Township, Northampton County, Pa.

[73] Assignee: AT&T Corp., Murray Hill, N.J.

[21] Appl. No.: 253,795

[22] Filed: Jun. 3, 1994

[51] Int. Cl.$^6$ .......................... H03K 19/094; H03K 3/356
[52] U.S. Cl. ................................. 326/95; 327/215
[58] Field of Search ..................... 326/95, 98; 327/203, 327/215

[56] References Cited

U.S. PATENT DOCUMENTS 5,144,163 9/1992 Matsuzawa et al. ............... 326/98
5,258,666 11/1993 Furuki ............................... 326/95
5,382,844 1/1995 Knauer .............................. 326/95
5,384,493 1/1995 Furuki ............................... 326/95

*Primary Examiner*—Edward P. Westin
*Assistant Examiner*—Richard Roseen
*Attorney, Agent, or Firm*—Scott W. McLellan

[57] ABSTRACT

An energy efficient logic gate circuit design that provides a substantially constant load to a clock source regardless of logic signal inputs to, or outputs from, the gate. The gate provides two complementary outputs and utilizes cross-coupled transistors to ensure that the outputs remain valid (complementary) after the logic inputs become invalid. Two blocks, each having a node coupling to the clock source and performing complementary logic functions, in combination with diodes for recharging the outputs of the gate, present the constant load to the clock source.

14 Claims, 3 Drawing Sheets

LOW ENERGY DIFFERENTIAL LOGIC GATE CIRCUITRY HAVING SUBSTANTIALLY INVARIANT CLOCK SIGNAL LOADING

BACKGROUND OF THE INVENTION

1. Field of the Invention

This invention relates to logic gate circuit designs in general and, more particularly, to energy efficient logic gate circuit designs, generally known as "adiabatic" logic or recovered energy logic.

2. Description of the Prior Art

Low energy computing requires the ability to implement complex logic functions with low power dissipation per gate even at high clock frequencies. Logic circuit designs that can provide energy efficient computation are available, such as that shown in U.S. patent applicant 08/069,994, filed May 28, 1993, having common inventors with this application and assigned to the same assignee. Further, the clock generator that drives the logic gate should be energy efficient such that the low energy advantage of the logic gate circuitry can be utilized. The low power logic and clock generators are sometimes referred to as "adiabatic" circuits since part of the energy used to perform the computations is recovered and reused for the next computation.

An efficient clock generator circuit is disclosed in U.S. patent application 08/229258, filed Apr. 18, 1994, by the same inventors as this application and assigned to the same assignee. For the desired high efficiency operation of the clock generator, the capacitive load on the outputs of the clock generator should be substantially invariant with respect to the logic inputs, intermediate and final results of the logic circuitry.

The logic circuit design in the above-referenced patent application suffers from providing a clock load that is dependent the computational results within each logic gate. Thus, using this logic circuit design with the above-referenced clock generator compromises the efficiency of the clock generator and may produce undesired distortions on the clock signal.

Thus, it is desirable to provide an energy efficient logic gate circuit design that provides a substantially invariant load to a clock generator regardless of the logic signals within the logic circuit.

Further, it is desirable to provide an energy efficient logic gate circuit design that does not cause significant clock signal distortion depending on the logic signals within the logic gate.

SUMMARY OF THE INVENTION

These and other aspects of the invention may be obtained generally in an integrated circuit logic gate circuit having at least first and second complementary inputs, first and second complementary outputs, and a clock input. The logic gate circuit includes first and second logic blocks, and cross-coupled first and second transistors. Each block has an input coupling to at least one of the complementary inputs, a node coupling to the clock input, and an output. The cross-coupled first and second transistors are each disposed in series between corresponding logic block outputs and the first and second complementary outputs.

The above aspects may also be obtained generally in an integrated circuit logic gate circuit having at least first and second complementary inputs, first and second complementary outputs, and a clock input. The circuit includes first and second logic blocks which implement mutually complementary predetermined logic functions, each block having an input coupling to at least one of the complementary inputs, a node coupling to the clock input, and an output coupling to the corresponding output of the logic gate circuit. The load to the clock input by the parallel combination of the first and second logic block circuits is substantially constant for allowable logic input combinations applied to the inputs of the logic gate circuit.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
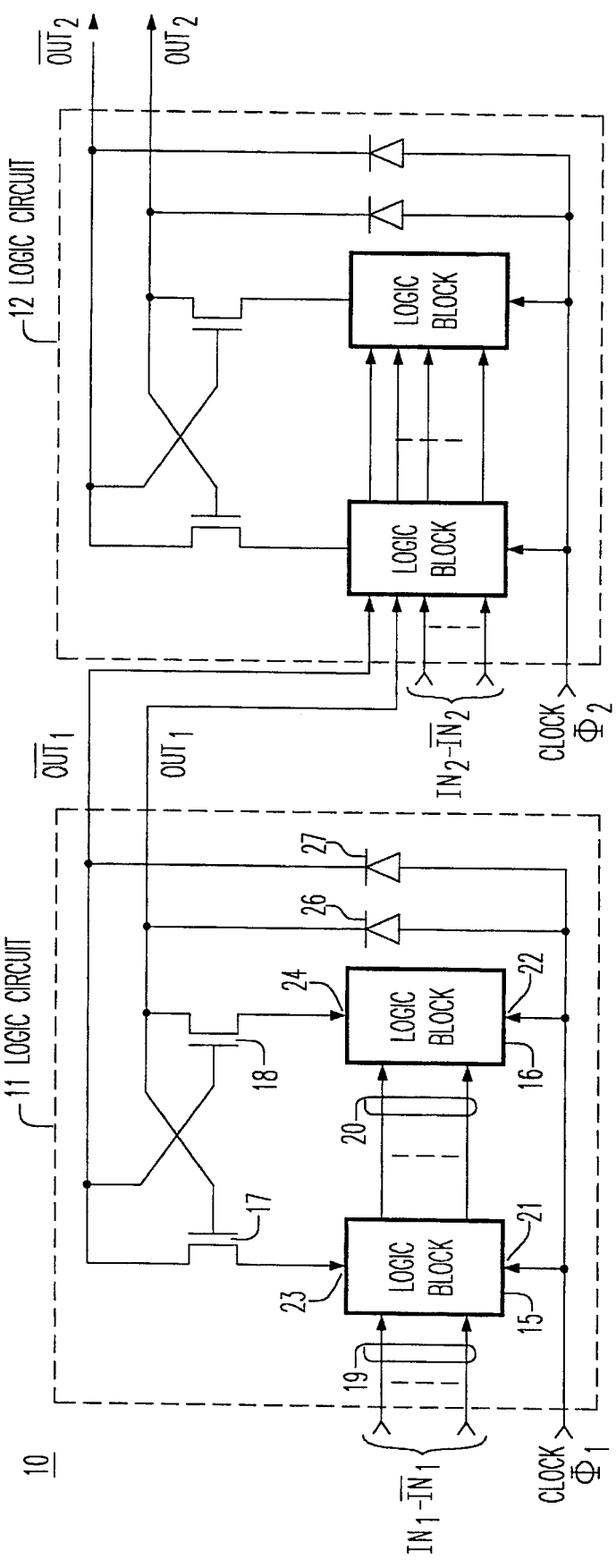
FIG. 1 is a simplified exemplary circuit diagram of a two gate logic circuit implementing general logic functions, according to one embodiment of the invention and suitable for integration into a integrated circuit.

Generally, the invention may understood by referring to FIG. 1 where a tandem combination 10 of logic gates 11, 12 are shown, suitable for integration into a single integrated circuit.

For purposes of the following explanation of an exemplary embodiment of the invention, common designations may be used to refer to different, but related, terms. For example, a clock signal and clock input may be referred to with the same symbol, $\phi$. Further, when logic signals are referred to herein as being complementary, it is understood that the logic signals are complementary when valid and not necessarily complementary when invalid.

The logic gate 11 in FIG. 1 has therein at least first and second complementary inputs $IN_1$ and $\overline{IN}_1$, a first and second complementary output $OUT_1$, $\overline{OUT}_1$, and a clock input $\phi_1$. The logic gate includes first and second logic blocks 15, 16, and cross-coupled first and second transistors 17, 18. Each block has at least one input 19, 20 coupling to at least one of the complementary inputs $IN_1$, $\overline{IN}_1$, a node 21, 22 coupling to the clock input $\phi_1$, and an output 23, 24. The cross-coupled first and second transistors 17, 18 are each disposed in series between corresponding logic block outputs 23, 24 and the first and second complementary outputs $OUT_1$, $\overline{OUT}_1$.

The first and second logic blocks 15, 16 implement mutually complementary predetermined logic functions. The load on the clock $\phi_1$ by the parallel combination of the first and second logic block circuits 15, 16 and precharge diodes 26, 27, is substantially constant for allowable logic input combinations applied to the inputs of the logic gate 11.

As discussed below in more detail and in accordance with one embodiment of the invention, the gates 11, 12 are respectively responsive to inputs $IN_1$-$\overline{IN}_1$ and $IN_2$-$\overline{IN}_2$, and clock phases $\phi_1$ and $\phi_2$. At least two clock phases, $\phi_1$, $\phi_2$ are used with multiple levels of logic gates and are needed because of the energy recovery nature of these logic gates, as will be evident below, and to insure valid data to a gate when the gate computes a result.

In more detail, the exemplary logic gate 11 in FIG. 1 has first and second logic blocks 15, 16 with respective nodes 21, 22, outputs 22, 24, and inputs 19, 20. The nodes 21, 22 are connected to a clock source $\phi_1$ and the outputs 23, 24 connect to cross-coupled transistors 17, 18. The cross-coupled transistors 17, 18 are disposed in series with the outputs of the logic blocks 15, 16 and respective logic gate complementary outputs $\overline{OUT}_1$, $OUT_1$. Because the blocks 15, 16 perform complementary logic functions, the cross-coupling assures that the outputs $\overline{OUT}_1$, $OUT_1$ are complementary and are either fully at one logic level or the complement when the outputs are "valid", as described below in connection with FIG. 4.

The logic inputs 19, 20 of blocks 15, 16 are driven from logic gate inputs $IN_1$, $\overline{IN}_1$. These inputs come from other logic gates (not shown) or from external inputs having logic levels sufficient to force transistors (not shown) in the blocks 15, 16, to be either conducting or substantially non-conducting, as will be shown below.

Diodes 26, 27 "recharge" the outputs $OUT_1$, $\overline{OUT}_1$, respectively, to reset the gate 11 when it is to perform another computation as will described in connection with FIG. 4. For purposes here, the diodes 26, 27 recharge or reset both of the outputs $OUT_1$, $\overline{OUT}_1$ when the clock signal on the clock input $\phi_1$ is high. During this time the outputs $OUT_1$, $\overline{OUT}_1$ are both high (not complementary). As the clock signal goes low, the gate 11 computes what the output should be for the given inputs $IN_1$, $\overline{IN}_1$. While the clock $\phi_1$ is low, the outputs are valid, complementary, and stable, holding the computed result.

The cross-coupled transistors 17, 18 serve as an interlock to prevent changes to the inputs to the gate from corrupting the outputs after computation of the logic function is completed by the gate. As will be discussed in more detail below, only one of the cross-coupled transistors will remain conducting, allowing the corresponding output $OUT_1$, $\overline{OUT}_1$ to be pulled low by the clock $\phi_1$. When one of the transistors 17, 18 is conducting, the other transistor is prevented from conducting because its gate is pulled low, keeping that transistor off.

Logic gate 12 is substantially identical to gate 11 in form. However, as discussed above, the gate 12 is driven by a different clock, $\phi_2$, than gate 11 and is responsive to the outputs of gate 11 and other inputs $IN_2$, $\overline{IN}_2$ if desired. The logic function of logic gate 12 may be different from the logic function of gate 11. As will be evident from FIG. 4, the clock phase $\phi_2$ is 180° out of phase with $\phi_1$, such that the inputs to gate 12 from gate 11 do not change when gate 12 is performing its computations.

Figure 2:
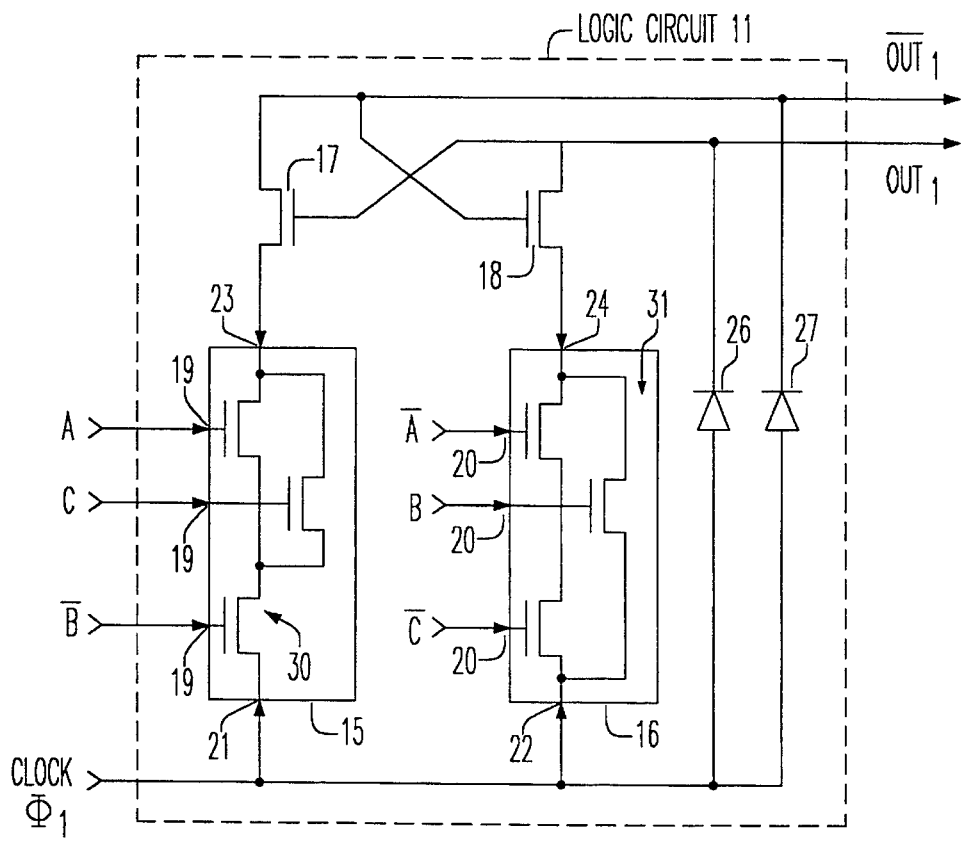
FIG. 2 is a simplified exemplary circuit diagram of a logic gate implementing a complex logic function.

In FIG. 2, the exemplary logic gate 11 performs the illustrative complex logic function:

$OUT_1 = (A+C) \cdot \overline{B} = \overline{\overline{(A \cdot C)} + B}$.

Output $\overline{OUT}_1$ follows the output 23 of block 15, which is:

$\overline{(A+C) \cdot \overline{B}}$, while the output $OUT_1$ follows the output 24 of block 16, which is:

$\overline{\overline{(A \cdot C)} + B}$.

A conventional combination of transistors 31 in block 16 implements, for purposes here, the "true" logic function of the gate 11 while a conventional combination of transistors 30 in block 15 performs the complement of the logic function. The block 16 is responsive to the complement of the inputs to block 15 and the combination of transistors 31 is the De Morgan dual of the combination of transistors 30.

It is noted that even though logically complementary operations are being performed by the two logic blocks 15, 16, the conductivity type of the transistors 17, 18, 30 and 31 are the same, here all NMOS transistors. However, it is understood that a mix of transistor polarities may be used.

Figure 3:
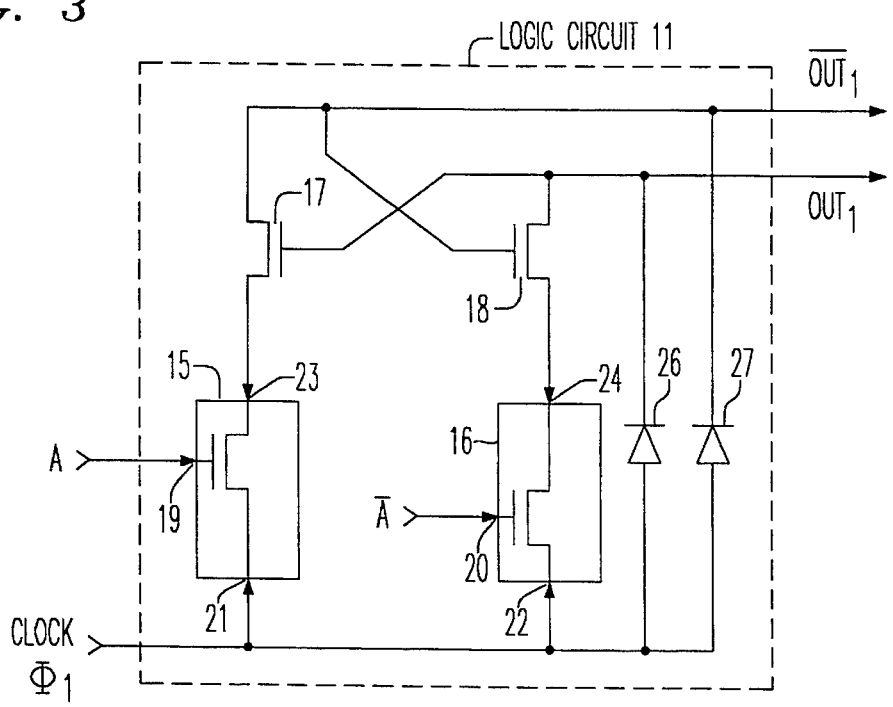
FIG. 3 is a simplified exemplary circuit diagram of an inverting logic gate.

In FIG. 3, an additional example of the logic gate 11 of FIG. 1 is shown as a logic inverter. Each block 15, 16 has one transistor therein to provide the inverting function. It is understood, however, that the inverter logic function may be performed without a gate 11 by simply reversing the outputs of any logic gate to a subsequent gate due to the fully differential nature of this logic family. Further, the inverting gate 11 may be made into a non-inverting buffer by exchanging its two outputs $OUT_1$, $\overline{OUT}_1$.

Figure 4:
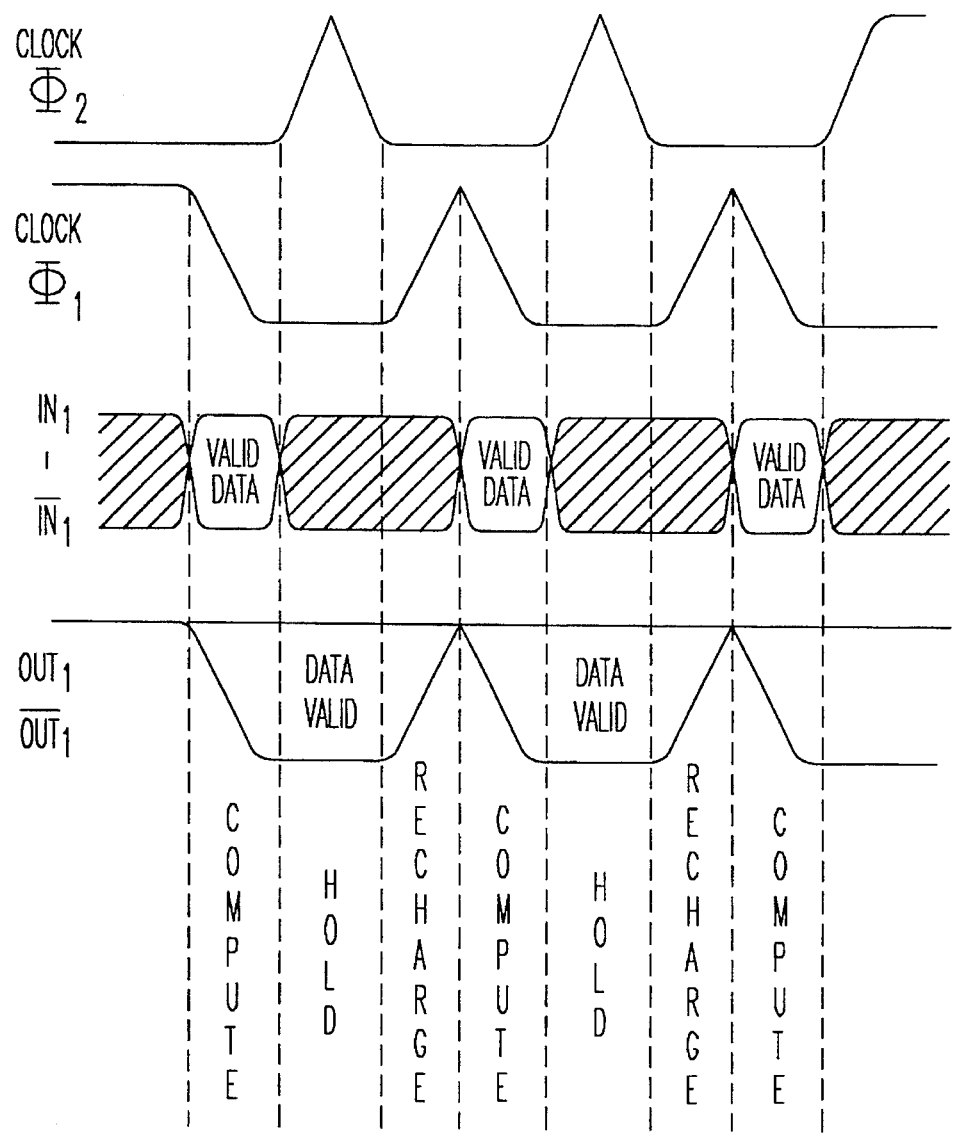
FIG. 4 is an exemplary timing diagram of a logic gate in FIG. 1, according to one embodiment of the invention.

The timing and operation of the logic gate 11 of FIG. 1 is shown in FIG. 4. As the clock signal $\phi_1$ falls from high to low, the gate 11 computes the result of the data applied to the inputs $IN_1$-$\overline{IN}_1$. While the clock transitions from high to low, the input data must be held constant (valid data). While the clock is low, the outputs $OUT_1$, $\overline{OUT}_1$ hold thereon the computed result until the clock returns high. The returning of the clock $\phi_1$ to the high state recharges the outputs $OUT_1$, $\overline{OUT}_1$ to the high state (via diodes 26, 27) for the next computation cycle.

Referring to FIGS. 1 and 4, as the clock transitions from high to low during the compute phase, only one of the outputs 23, 24 of the blocks 15, 16 goes low as a result of the applied inputs $IN_1$,-$\overline{IN}_1$. Initially, the gate, source and drain terminals of both transistors 17, 18 are high. As one of the logic block 15, 16 outputs 23, 24 goes low in response to the clock $\phi_1$ going low, the source of one of the transistors 17, 18 is also pulled low, turning it on and pulling low the respective one of the gate 11 outputs $OUT_1$, $\overline{OUT}_1$. This, in turn, pulls the gate of the other transistor 17, 18 low to keep it off. Thus, only one transistor 17, 18 will remain conducting. The non-conducting transistor acts as an interlock against corruption of the outputs $OUT_1$, $\overline{OUT}_1$ from changing inputs $IN_1$-$\overline{IN}_1$ after the computation phase is complete. The transistor that remains on allows the corresponding output $OUT_1$, $\overline{OUT}_1$ to be pulled low by the clock $\phi_1$ via the conducting block 15, 16. For example, if the inputs have the correct combination to cause block 15 to conduct, the gate of transistor 18 goes low and is turned off. Transistor 17 remains conductive and the clock $\phi_1$ pulls the output $\overline{OUT}_1$ low, leaving output $OUT_1$ high. Output $OUT_1$ is assured to remain high while the clock input $\phi_1$ is low regardless of the inputs because of the interlocking feature of transistor 18 remaining off.

It is noted that other transistor conductivities may be used instead of the NMOS devices shown here. Further, combinations of different conductivity types as well as bipolar transistors may be used with the according changes to the circuitry disclosed herein.

To illustrate the two phase operation of logic gates 11 and 12, clock phase $\phi_1$ is shown in FIG. 4. Since the operation principles of gate 12 are substantially identical to than of gate 11, the above discussion is sufficient to describe the operation thereof. The major difference between the two gates, besides different logic signals applied to the inputs thereof, is the difference in the clock phases. As shown, the clock phase $\phi_2$ is substantially identical to the clock phase $\phi_1$ but shifted 180°. Consequently, the other waveforms pertaining to gate 12 are shifted 180° from that shown for gate 11. Thus, while the gate 11 is in the "hold" portion of the cycle as shown in FIG. 4 (the outputs of gate 11 are steady), gate 12 performs a recharge and compute using the data from the gate 11. It is contemplated that the phase difference between the two clocks (phase shift) may be different from 180° as long as the data input to the gate remains steady during the compute phase. Thus, for multiple levels of gates, a corresponding number of clock phases may be provided (e.g., four), although only two clock phases are required.

The clock waveforms depicted in this example are exemplary and are used to illustrate the energy conserving nature of this logic gate design. Generally, the steeper the slopes of the waveform, the more energy dissipated by the gate. Conversely, the slower the rise and fall times of the waveform, the less energy dissipated. Other waveforms may be used that are more compatible with the clock generator (not shown) used to produce the clock signals. To achieve high efficiency, the clock generator should be of a design that reuses energy stored in the capacitances of the clock wiring and the logic gates coupled thereto, such as that disclosed in the above-referenced patent application. However, the logic gates disclosed herein may be operated from conventional clock sources that do not recover stored energy, including sources that produce fast rise/fall waveforms (e.g., square waves) but without the attendant savings in energy dissipation.

Figure 5:
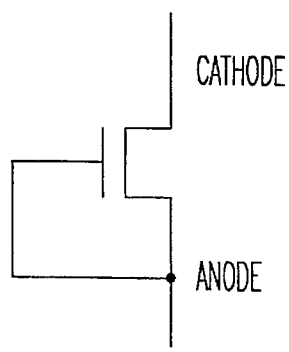
FIG. 5 is an exemplary implementation of the diodes shown in FIGS. 1–3.

The diodes 26, 27 preferably have a low forward voltage so that as little as possible power is dissipated therein. In the preferred exemplary embodiment, the diodes 26, 27 are each implemented as a diode-connected MOS transistor (gate connected to the drain of an NMOS transistor) as shown in FIG. 5. Other exemplary diodes types that are suitable for diodes 26, 27 are Schottky-barrier diodes because of the low forward voltage thereof. However, conventional PN diodes or saturated mode bipolar transistors may be used.

EXEMPLARY RESULTS

A chain of one thousand single inverter gates has been fabricated in 0.9 μm CMOS technology. Compared to a conventional CMOS (two transistor) inverter, the new inverter gate is approximately 20% smaller than the old inverter gate. Further, the new inverter dissipates about one third the power of the old design operating at 100 MHz.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

We claim:

1. In an integrated circuit, a logic circuit having at least first and second complementary inputs, first and second complementary outputs, and a clock input, CHARACTERIZED BY:

first and second logic blocks, each block having an input coupling to at least one of the complementary inputs, a node coupling to the clock input, and an output; and cross-coupled first and second transistors each being disposed in series between corresponding logic block outputs and first and second complementary outputs.

2. The logic circuit recited in claim 1, wherein the first and second logic blocks each have at least one transistor, the transistor having two outputs and an input, the input coupling to an input of the logic block and respective ones of the two outputs coupling to the node and output of that block.

3. The logic circuit recited in claim 1, wherein the first and second logic blocks are each characterized by: a combination of transistors, each transistor having two outputs and an input, each input coupling to an input of the logic block and respective ones of the two outputs coupling to the node and output of the block; wherein the combination of transistors in the first block performs a predetermined logic function and the other logic block performs the complement of the predetermined logic function.

4. The logic circuit as recited in claims 2 or 3, further characterized by a recharge circuit disposed between the clock input and the complementary outputs of the logic circuit.

5. The logic gate as recited in claim 4, wherein the transistors are all of the same polarity.

6. The logic circuit recited in claim 5, wherein the recharge circuit are first and second diodes disposed between the clock input and corresponding outputs of the logic circuit.

7. A logic array characterized by at least two logic circuits as recited in claim 1, disposed in series as first and second logic circuits, wherein the clock input to the first logic circuit is driven by a clock signal phase shifted relative to a clock signal driving the clock input to the second logic circuit.

8. In an integrated circuit, a logic circuit having at least first and second complementary inputs, first and second complementary outputs, and a clock input, CHARACTERIZED BY:

first and second logic blocks which implement mutually complementary predetermined logic functions, each block having an input coupling to at least one of the complementary inputs, a node coupling to the clock input providing a load on the clock input, and outputs coupling to the corresponding first and second complementary outputs of the logic circuit;

wherein the first and second logic blocks each have at least one transistor, the transistor having two outputs and an input, the input coupling to an input of the logic block and respective ones of the two outputs coupling to the node and the output of that block, and wherein the load to the clock input provided by the combination of the first and second logic blocks is substantially constant for allowable logic input combinations applied to the inputs of the logic circuit.

9. The logic circuit recited in claim 8, wherein the first and second logic blocks are each characterized by: a combination of transistors, each transistor having two outputs and an input, each input coupling to an input of the logic block and respective ones of the two outputs coupling to the node and the output of the block; wherein the combination of transistors in the first block performs the predetermined logic function and the other logic block performs the complement of the predetermined logic function.

10. The logic circuit as recited in claims 9, further characterized by:

cross-coupled first and second transistors each being disposed in series between corresponding logic block outputs and first and second complementary outputs.

11. The logic circuit as recited in claims 10, further characterized by a recharge circuit disposed between the clock input and the complementary outputs of the logic circuit.

12. The logic gate as recited in claim 11, wherein the transistors are all of the same polarity.

13. The logic circuit recited in claim 12, wherein the recharge circuit are first and second diodes disposed between the clock input and corresponding outputs of the logic circuit.

14. A logic array characterized by at least two series-coupled logic circuits as recited in claim 8, wherein the the clock input to the first logic circuit is driven by a clock signal phase shifted from a clock signal driving the clock input to the second logic circuit.

* * * * *